(12) United States Patent
Watanabe et al.

(10) Patent No.: US 9,270,236 B2
(45) Date of Patent: Feb. 23, 2016

(54) POWER AMPLIFIER

(71) Applicant: Mitsubishi Electric Corporation, Tokyo (JP)

(72) Inventors: Shintaro Watanabe, Tokyo (JP); Kazuhiro Iyomasa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 16 days.

(21) Appl. No.: 14/269,267

(22) Filed: May 5, 2014

(65) Prior Publication Data

US 2015/0070096 A1 Mar. 12, 2015

(30) Foreign Application Priority Data

Sep. 11, 2013 (JP) ................................. 2013-188459

(51) Int. Cl.
| | | |
|---|---|---|
| *H03F 3/14* | (2006.01) | |
| *H03F 1/56* | (2006.01) | |
| *H03F 3/195* | (2006.01) | |
| *H03F 3/24* | (2006.01) | |

(52) U.S. Cl.
CPC ............... *H03F 1/565* (2013.01); *H03F 3/195* (2013.01); *H03F 3/245* (2013.01); *H03F 2200/165* (2013.01); *H03F 2200/222* (2013.01)

(58) Field of Classification Search
USPC ......................................... 330/307, 302, 306
IPC ........................................................ H03F 3/14
See application file for complete search history.

(56) References Cited

U.S. PATENT DOCUMENTS

| | | | | |
|---|---|---|---|---|
| 4,107,621 | A | * | 8/1978 | Furutani et al. ............... 330/296 |
| 4,271,433 | A | * | 6/1981 | Theriault ....................... 348/731 |
| 6,166,599 | A | * | 12/2000 | Aparin et al. .................. 330/149 |
| 8,264,282 | B1 | * | 9/2012 | Riekki et al. ................... 330/302 |
| 2002/0014920 | A1 | * | 2/2002 | Ohnishi et al. ................. 330/295 |
| 2002/0149428 | A1 | * | 10/2002 | Toncich et al. ................ 330/302 |
| 2005/0077964 | A1 | | 4/2005 | Maeda |
| 2012/0149321 | A1 | * | 6/2012 | Montalvo et al. ........... 455/232.1 |
| 2012/0293265 | A1 | * | 11/2012 | Heikkinen et al. ............. 330/291 |

FOREIGN PATENT DOCUMENTS

| | | |
|---|---|---|
| JP | 9-83268 A | 3/1997 |
| JP | 10-209769 A | 8/1998 |
| JP | 2005-143079 A | 6/2005 |

(Continued)

OTHER PUBLICATIONS

Taiwan Patent Office; Office Action in Taiwanese Patent Application No. 10421164460 (Aug. 28, 2015).

*Primary Examiner* — Patricia T Nguyen

(74) *Attorney, Agent, or Firm* — Leydig, Voit & Mayer, Ltd.

(57) ABSTRACT

A power amplifier is smaller in size and limits input noise having a differential frequency. A power amplifier has an input terminal, an amplifying transistor, a bias circuit, a filter circuit, and an impedance matching circuit. The bias circuit supplies a bias to the signal input side of the amplifying transistor. The filter circuit removes noise at the signal input side of the amplifying transistor. The filter circuit has a matching resistor, a chip inductor, and a chip capacitor. Each of the chip inductor and the chip capacitor is a surface mount device. The matching resistor is located on a semiconductor substrate, has a first end connected to a connection point of two MIM capacitors, and a second end connected to a connection point of one of the MIM capacitors and the signal input side of the amplifying transistor.

11 Claims, 3 Drawing Sheets

(56) References Cited

FOREIGN PATENT DOCUMENTS

| JP | 2007-174442 A | 7/2007 |
| JP | 2008-28635 A | 2/2008 |
| JP | 2013-110619 A | 6/2013 |

* cited by examiner

POWER AMPLIFIER

BACKGROUND OF THE INVENTION

1. Field of the Invention

The present invention relates to a power amplifier.

2. Background Art

With a power amplifier used in a transmitter-receiver, there is a problem that reception band noise increases with increase of electric power leaking out into a reception band. The amount of electric power leaking out into the reception band is therefore specified.

One of causes of deterioration of reception band noise characteristics is differential frequency noise. Differential frequency noise is noise of the difference between the frequency of a transmission frequency and a reception frequency. When differential frequency noise is mixed in a transmission frequency signal, the electric power of the noise is amplified to cause degradation of a reception band noise characteristic. A power amplifier having a function to reduce the impedance at a differential frequency as a means for coping with such differential frequency noise, as disclosed in, for example, Japanese Patent Laid-Open No. 2008-28635, has been known.

Other prior art includes Japanese Laid-Open Patent Publication No. H10-209769, Japanese Laid-Open Patent Publication No. H9-83268, Japanese Laid-Open Patent Publication No. 2007-174442, and Japanese Laid-Open Patent Publication No. 2005-143079.

There are a plurality of frequency bands determined in accordance with communication standards as reception frequency bands and transmission frequency bands. More specifically, there are reception and transmission frequency bands of about several hundred to a thousand and several hundred megahertz. A differential frequency is the difference between a reception frequency band and a transmission frequency band and is ordinarily about several ten megahertz.

Technique using a filter circuit for removing differential frequency noise in combination with a power amplifier, described in Japanese Patent Laid-Open No. 2008-28635 have been used. In a case where a resonance circuit is used as the filter circuit, the resonance frequency determined by an inductor and a capacitor is set to a value of about several ten megahertz in correspondence with the differential frequency. This resonance frequency is lower by an order of magnitude than the reception band frequency.

Setting the resonance frequency to a value close to the differential frequency requires selecting substantially large capacitance and inductance values which are much larger than the values realized by a metal-insulator-metal (MIM) capacitor and a spiral inductor on a semiconductor substrate. In actuality, it is necessary to use surface mount devices as the inductor and capacitor. The size of the power amplifier is considerably increased due to the existence of such indispensable surface mount devices, and there is a demand for power amplifiers smaller in size.

SUMMARY OF THE INVENTION

The present invention has been achieved to solve the above-described problem and an object of the present invention is to provide a power amplifier smaller in size and capable of limiting input noise having a differential frequency.

According to a first aspect of the present invention, a power amplifier includes: a semiconductor substrate; an input terminal; an amplifying transistor; a bias circuit; a filter circuit; and an impedance matching circuit. The amplifying transistor is formed on the semiconductor substrate, and amplifies a signal from the input terminal and outputs to an output terminal. The bias circuit is capable to supply a bias to a signal input side of the amplifying transistor. The filter circuit includes at least one of a chip inductor and a chip capacitor, and removes noise at the signal input side of the amplifying transistor. The impedance matching circuit includes a matching resistor. The matching resistor is formed on the semiconductor substrate and is provided between the input terminal and the signal input side of the amplifying transistor.

According to a second aspect of the present invention, a power amplifier includes: a semiconductor substrate; an input terminal; an amplifying transistor; a bias circuit; an impedance matching circuit; and a filter circuit. The amplifying transistor is formed on the semiconductor substrate, and amplifies a signal from the input terminal and outputting to an output terminal. The bias circuit is capable to supply a bias to a signal input side of the amplifying transistor. The impedance matching circuit is provided between the input terminal and the signal input side of the amplifying transistor. The impedance matching circuit includes an inductor and a capacitor formed on the semiconductor substrate. The filter circuit includes a resistor and a chip capacitor formed on the semiconductor substrate. The resistor and the chip capacitor are connected in series to each other. One end of the filter circuit is connected to a connection point between the bias circuit and the signal input side of the amplifying transistor, and the other end of the filter circuit connected to a ground.

Other and further objects, features and advantages of the invention will appear more fully from the following description.

DETAILED DESCRIPTION OF THE PREFERRED EMBODIMENTS

First Embodiment

Figure 1:
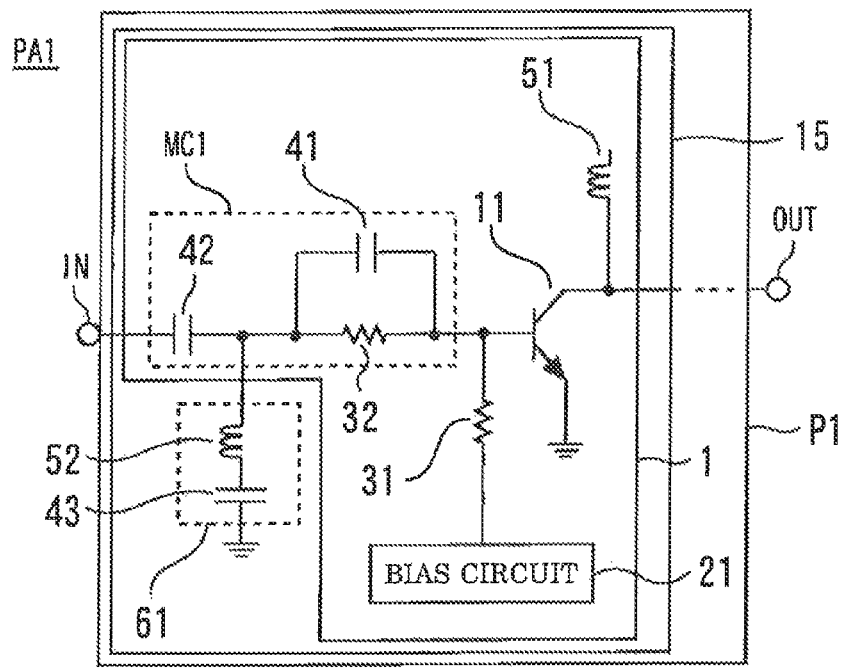
FIG. 1 is a diagram showing a power amplifier according to a first embodiment of the present invention.

FIG. 1 is a diagram showing a power amplifier PA1 according to a first embodiment of the present invention. The power amplifier PA1 has an input terminal IN, an amplifying transistor 11, a bias circuit 21, a filter circuit 61 and an impedance matching circuit MC1. The power amplifier PA1 is a multi-band power amplifier in which input signals in a plurality of bands are amplified by means of the amplifying transistor 11, and which is used for wireless communication in a portable telephone set or the like.

The power amplifier PA1 has the amplifying transistor 11, the bias circuit 21 and the impedance matching circuit MC1 integrated on a semiconductor substrate 1. In FIG. 1, the circuit elements formed on the semiconductor substrate 1 are illustrated in a region surrounded by a solid line indicating the semiconductor substrate 1.

In the filter circuit 61 and other circuits described below, surface mount devices (SMDs) are used. The surface mount devices are housed in a semiconductor package P1 together with the semiconductor substrate 1.

The semiconductor package P1 has a multilayer circuit substrate 15. The semiconductor substrate 1 is die-bonded and wire-bonded on the multilayer circuit substrate 15, and the surface mount devices are solder-mounted on the multilayer circuit substrate 15. In the semiconductor package P1, the semiconductor substrate 1, the surface mount devices and the multilayer circuit substrate 15 are resin-molded. This kind of semiconductor package is a not new but well-known matter. Therefore, no further description will be made of the semiconductor package P1.

The amplifying transistor 11 is formed on the semiconductor substrate 1, amplifies a signal from the input terminal IN and outputs to an output terminal OUT. A bipolar transistor can be used as the amplifying transistor 11. The bipolar transistor may be a heterojunction bipolar transistor (HBT). The amplifying transistor 11 may alternatively be a field effect transistor (FET).

The bias circuit 21 is connected to one end of a resistor 31. The other end of the resistor 31 is connected to a connection point between the signal input side of the amplifying transistor 11 and a matching resistor 32. The bias circuit 21 can supply a bias to the signal input side of the amplifying transistor 11.

In FIG. 1, only a single stage of the amplifying transistor 11 is illustrated. However, the present invention is not limited to this arrangement. One or more transistors may be connected to the amplifying transistor 11 in a multistage connection to form a power amplifier having amplifying transistors in two or more amplification stages.

The filter circuit 61 removes noise at the signal input side of the amplifying transistor 11. The filter circuit 61 has a chip inductor 52 and a chip capacitor 43. Each of the chip inductor 52 and the chip capacitor 43 is a surface mount device (SMD). Concrete examples of surface mount devices in widespread use are chip resistors, chip inductors and chip capacitors.

With a power amplifier used in a transmitter-receiver, there is a problem that reception band noise increases with increase of electric power leaking out into a reception band. The amount of electric power leaking out into the reception band is specified.

One of causes of deterioration of reception band noise characteristics is mixing of differential frequency noise in a transmission frequency signal and amplification of the electric power of the noise. The differential frequency noise is noise of the difference between the frequency of a transmission frequency signal and a reception frequency.

The resonance frequency determined by the inductance value L of the chip inductor 52 and the capacitance value C of the chip capacitor 43 in the filter circuit 61 is set in the vicinity of this differential frequency. A short-circuit path through the filter circuit 61 can thus be formed to selectively let out differential frequency noise to ground. Limiting of the input of differential frequency noise to the input side of the amplifying transistor 11 is thus enabled.

The impedance matching circuit MC1 has the matching resistor 32. The matching resistor 32 is formed on the semiconductor substrate 1 and provided between the input terminal IN and the signal input side of the amplifying transistor 11.

Specifically, the impedance matching circuit MC1 has the matching resistor 32, an MIM capacitor 41 and an MIM capacitor 42. Each of the MIM capacitors 41 and 42 is a metal-insulator-metal (MIM) capacitor formed on the semiconductor substrate 1. One end of the MIM capacitor 42 is connected to the input terminal IN. One end of the MIM capacitor 41 is connected to the other end of the MIM capacitor 42. The other end of the MIM capacitor 41 is connected to the signal input side of the amplifying transistor 11.

One end of the matching resistor 32 is connected to a connection point between the MIM capacitor 42 and the MIM capacitor 41, while the other end of the matching resistor 32 is connected to a connection point between the MIM capacitor 41 and the signal input side of the amplifying transistor 11. The matching resistor 32 is an intermediate portion of a wiring pattern formed on the semiconductor substrate 1 as a high-resistivity portion.

An inductor 51 is provided as a so-called feed line. The inductor 51 is a spiral inductor formed on the semiconductor substrate 1.

For forming each of the resistors on the semiconductor substrate 1, a high-resistivity portion provided at an intermediate position in a wiring pattern formed on the semiconductor substrate 1 suffices, so that the necessary area for the resistor can be limited to a markedly small area. In contrast, for each of the MIM capacitors, an electrode extending to a certain extent on the semiconductor substrate is required. Forming the spiral inductor also requires providing a metal pattern in spiral form on the semiconductor substrate. Therefore, the necessary areas for the MIM capacitors and the spiral inductor on the semiconductor substrate are comparatively large. The resistors can be formed in smaller areas on the semiconductor substrate 1 in comparison with the MIM capacitors and the spiral inductor that are devices formed on the same semiconductor substrate 1.

In the present embodiment, therefore, the matching resistor 32 is formed on the semiconductor substrate 1 and impedance matching is performed by using this resistor instead of using a typical T-type CLC matching circuit. Thus, in the power amplifier PA1 according to the first embodiment, at least a reduction in area corresponding to the replacement of a spiral inductor with a resistor is achieved in comparison with a power amplifier using a T-type CLC matching circuit.

In the present embodiment, as described above, the matching resistor 32 is provided in the impedance matching circuit MC1, so that input matching for the power amplifier PA1 can be performed by using a device of a smaller area. By reducing the size of the impedance matching circuit MC1, the power amplifier PA1 capable of limiting input noise having the differential frequency and reduced in size is provided.

The power amplifier PA1 is a multiband power amplifier and therefore amplifies signals in a wide band. The frequency band can be increased if the input matching circuit is formed as a resistor matching circuit. Therefore, the impedance matching circuit MC1 having the matching resistor 32 is suitable for the power amplifier PA1 designed as a multiband amplifier.

Figure 2:
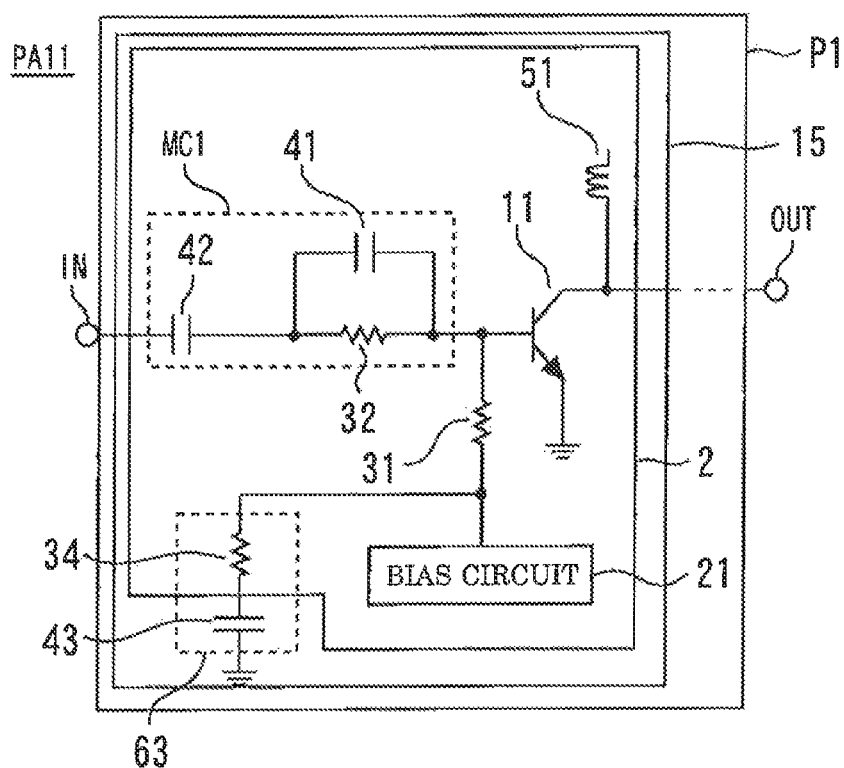
FIG. 2 is a diagram showing a power amplifier according to a modified example of the first embodiment of the present invention.

FIG. 2 is a diagram showing a power amplifier PA11 according to a modified example of the first embodiment of the present invention. The power amplifier PA11 differs from the power amplifier PA1 according to the first embodiment in that the filter circuit 61 is replaced with a filter circuit 63, but is otherwise the same.

The power amplifier PA11 has a semiconductor substrate 2. A resistor 34 is provided on the semiconductor substrate 2 as a component part of the filter circuit 63. The filter circuit 63 has the resistor 34 and a chip capacitor 43. The resistor 34 is formed on the semiconductor substrate 2. One end of the resistor 34 is connected to a connection point between the bias circuit 21 and the signal input side of the amplifying transistor 11.

The chip capacitor 43 is provided as a surface mount device in the form of a chip capacitor and connected to the resistor 34. The resistor 34 is an intermediate portion of a wiring pattern formed on the semiconductor substrate 2 as a high-resistivity portion.

The filter circuit 63 is an RC circuit in which the resistor 34 formed on the semiconductor substrate 2 and the chip capacitor 43 provided as a surface mount device are connected in series. One end of the RC circuit is connected to a connection point between the bias circuit 21 and the signal input side of the amplifying transistor 11. The other end of the RC circuit is grounded.

The filter circuit 63 has the resistor 34 with which the chip inductor in the filter circuit 61 can be replaced, and which is a high-resistance portion of a pattern formed on the semiconductor substrate 2. Thus, the surface mount device can be replaced with a high-resistance pattern portion to achieve a reduction in size of the power amplifier PA11.

Second Embodiment

Figure 3:
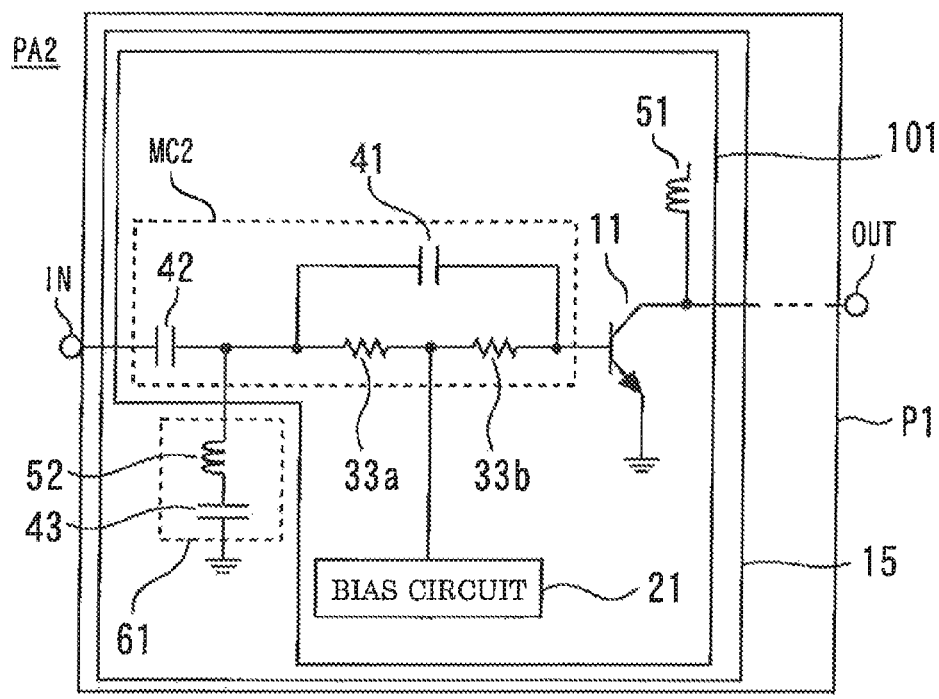
FIG. 3 is a diagram showing a power amplifier according to a second embodiment of the present invention.

FIG. 3 is a diagram showing a power amplifier PA2 according to a second embodiment of the present invention. The power amplifier PA2 differs from the power amplifier PA1 according to the first embodiment in that the matching resistor 32 is replaced with matching resistors 33a and 33b; the resistor 31 is not provided; and the bias circuit 21 is connected to a middle point between the matching resistors 33a and 33b, but is otherwise the same.

The power amplifier PA2 has a semiconductor substrate 101. An impedance matching circuit MC2 is provided on the semiconductor substrate 101. The impedance matching circuit MC2 has the series circuit formed of the matching resistors 33a and 33b. One end of the matching resistor 33a is connected to the other end of the MIM capacitor 42. One end of the matching resistor 33b is connected to the other end of the matching resistor 33a. The other end of the matching resistor 33b is connected to the other end of the MIM capacitor 41. The MIM capacitor 41 is connected in parallel with the series circuit formed of the matching resistors 33a and 33b. The resistance of the resistor 33a for realizing the performance equivalent to that of the power amplifier PA1 according to the first embodiment is equal to a value obtained by subtracting the resistance of the resistor 31 from the resistance of the matching resistor 32.

The bias circuit 21 is connected to a connection point between the matching resistor 33a and the matching resistor 33b. The bias circuit 21 supplies a bias to the signal input side of the amplifying transistor 11 through the matching resistor 33b. A circuit in thus realized which is comparable to the circuit in the first embodiment in which the bias circuit 21 supplies a bias to the signal input side of the amplifying transistor 11 through the resistor 31. With the matching resistors 33a and 33b, resistor matching is realized, as is that using the matching resistor 32 in the first embodiment.

Thus, the matching resistor 33b serves both as a series resistor inserted between the bias circuit 21 and the amplifying transistor 11 and as a means for impedance matching. Use of the matching resistor 33b for the two purposes ensures that the function equivalent to that of the arrangement using the resistor 31 and the matching resistor 32 provided separately from each other in the first embodiment can be obtained while the area necessary for the resistors is reduced.

Third Embodiment

Figure 4:
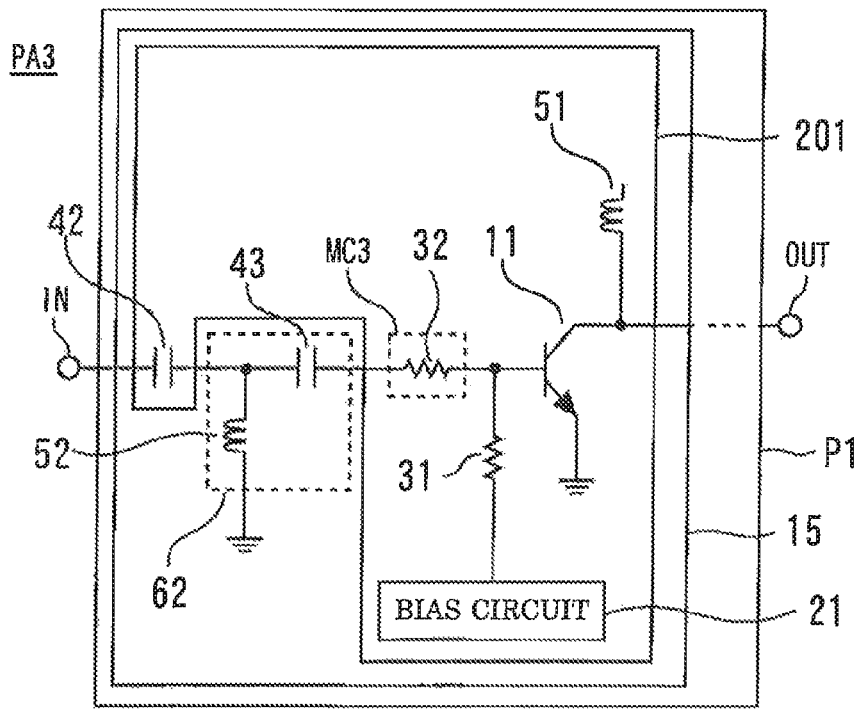
FIG. 4 is a diagram showing a power amplifier according to a third embodiment of the present invention.

FIG. 4 is a diagram showing a power amplifier PA3 according to a third embodiment of the present invention. The power amplifier PA3 differs from the power amplifier PA1 according to the first embodiment in that the impedance matching circuit MC1 is replaced with an impedance matching circuit MC3, and that the filter circuit 61 is replaced with a filter circuit 62, but is otherwise the same.

The filter circuit 62 has a chip inductor 52 and a chip capacitor 43. The chip inductor 52 and the chip capacitor 43 are surface mount devices. In this respect, the filter circuit 62 is the same as the filter circuit 61. However, the inductor and the capacitor are connected in a different form.

That is, in the power amplifier PA3, the chip capacitor 43 is inserted in a series connection between the MIM capacitor 42 and the matching resistor 32. One end of the chip inductor 52 is connected to a connection point between the MIM capacitor 42 and the chip capacitor 43. The other end of the chip inductor 52 is grounded.

The impedance matching circuit MC3 is formed of the matching resistor 32. One end of the matching resistor 32 is connected to the other end of the filter capacitor that is the chip capacitor 43. The other end of the matching resistor 32 is connected to the signal input side of the amplifying transistor 11. Input matching using only the matching resistor 32 enables reducing the numbers of elements for input matching relative to those in the first and second embodiments.

Fourth Embodiment

Figure 5:
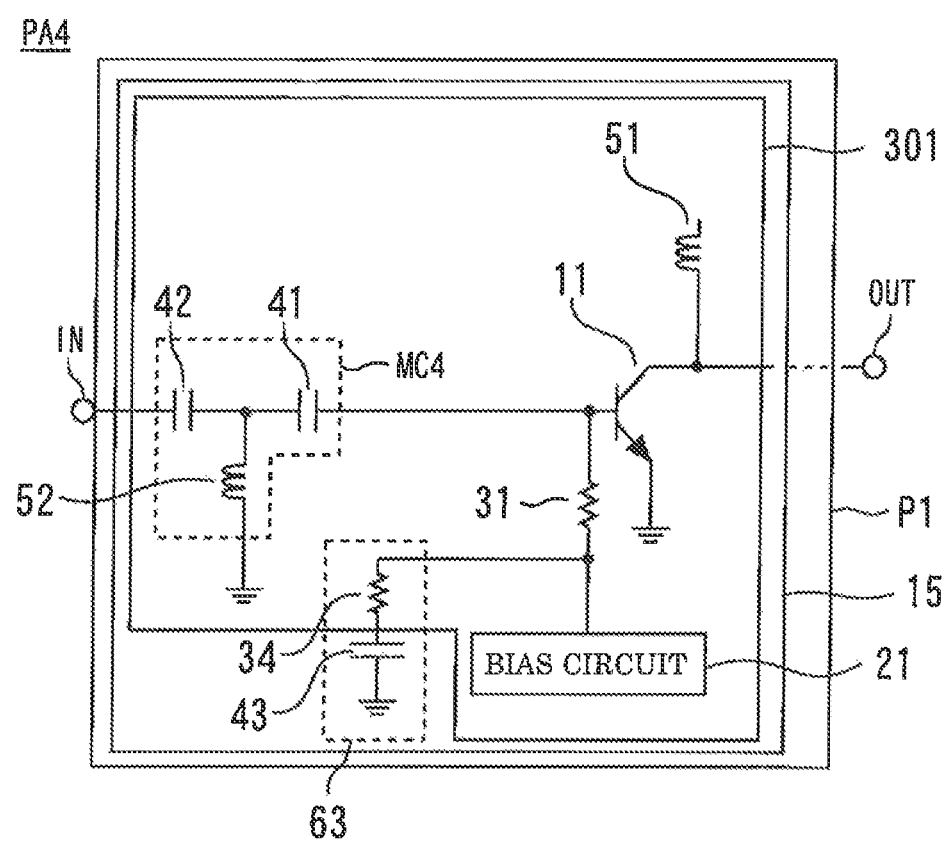
FIG. 5 is a diagram showing a power amplifier according to a fourth embodiment of the present invention.

FIG. 5 is a diagram showing a power amplifier PA4 according to a fourth embodiment of the present invention. The power amplifier PA4 differs from the power amplifier PA11 according to the modified example of the first embodiment in that the impedance matching circuit MC1 is replaced with an impedance matching circuit MC4, but is otherwise the same.

The impedance matching circuit MC4 is a T-type CLC matching circuit formed of a chip inductor 52 and MIM capacitors 41 and 42 formed on a semiconductor substrate 301. This T-type CLC matching circuit is provided between the input terminal IN and the signal input side of the amplifying transistor 11.

The power amplifier PA4 according to the fourth embodiment has the filter circuit 63, as does the power amplifier PA11 according to the modified example of the first embodiment. In the filter circuit 63, an RC filter circuit can be formed by using a high-resistance portion of a pattern formed on the semiconductor substrate 2, thus achieving a reduction in size of the power amplifier.

The features and advantages of the present invention may be summarized as follows. According to the present invention, a power amplifier smaller in size and capable of limiting input noise having a differential frequency is provided.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-188459, filed on Sep. 11, 2013, including specification, claims, drawings, and summary, on which the Convention priority of the present application is based, is incorporated herein by reference in its entirety.

What is claimed is:

1. A power amplifier comprising:
    a semiconductor substrate;
    an input terminal;
    an amplifying transistor located on the semiconductor substrate, amplifying a signal from the input terminal, and outputting an amplified signal to an output terminal;

a bias circuit supplying a bias to a signal input side of the amplifying transistor;
a filter circuit, including at least one of a chip inductor and a chip capacitor, removing noise at the signal input side of the amplifying transistor; and
an impedance matching circuit including
a matching resistor located on the semiconductor substrate, between the input terminal and the signal input side of the amplifying transistor,
a first capacitor located on the semiconductor substrate, wherein a first end of the first capacitor is connected to the input terminal, and
a second capacitor located on the semiconductor substrate, wherein
a first end of the second capacitor is connected to a second end of the first capacitor,
a second end of the second capacitor is connected to the signal input side of the amplifying transistor,
a first end of the matching resistor is connected to a connection point of the first capacitor and the second capacitor, and
a second end of the matching resistor is connected to a connection point of the second capacitor and the signal input side of the amplifying transistor.

2. The power amplifier according to claim 1, wherein the matching resistor includes:
a first resistor, wherein a first end of the first resistor is connected to the second end of the first capacitor, and
a second resistor, wherein a first end of the second resistor is connected to a second end of the first resistor, a second end of the second resistor is connected to the second end of the second capacitor; and
the bias circuit is connected to a connection point of the first resistor and the second resistor, and supplies the bias to the connection point.

3. The power amplifier according to claim 1, wherein
the filter circuit is a serial LC resonance circuit including both of the chip inductor and the chip capacitor, connected in series to each other, and
a first end of the serial LC resonance circuit is connected to a connection point of the first capacitor and the matching resistor, a second end of the serial LC resonance circuit is connected to ground.

4. The power amplifier according to claim 1, wherein
the filter circuit is a LC resonance circuit including both of the chip inductor and the chip capacitor, wherein a first end of the chip inductor is electrically connected to the input terminal, a first end of the chip capacitor is connected to a connection point of the chip inductor and the chip capacitor, and a second end of the chip capacitor is connected to ground; and
a first end of the matching resistor is connected to the first end of the chip inductor, and a second end of the matching resistor is connected to the signal input side of the amplifying transistor.

5. The power amplifier according to claim 1, wherein the filter circuit includes:
a resistor located on the semiconductor substrate, wherein a first end of the resistor is connected to a connection point of the bias circuit and the signal input side of the amplifying transistor; and
the chip capacitor, wherein a first end of the chip capacitor is connected to a second end of the resistor, and a second end of the chip capacitor is connected to ground.

6. A power amplifier comprising:
a semiconductor substrate;
an input terminal;
an amplifying transistor located on the semiconductor substrate, amplifying a signal from the input terminal, and outputting an amplified signal to an output terminal;
a bias circuit supplying a bias to a signal input side of the amplifying transistor;
an impedance matching circuit located between the input terminal and the signal input side of the amplifying transistor, wherein the impedance matching circuit includes an inductor and a capacitor that are located on the semiconductor substrate; and
a filter circuit including a resistor and a chip capacitor located on the semiconductor substrate, wherein
the resistor and the chip capacitor are connected in series to each other, and
a first end of the filter circuit is connected to a connection point of the bias circuit and the signal input side of the amplifying transistor, and a second end of the filter circuit is connected to ground.

7. The power amplifier according to claim 1, wherein the power amplifier is a multiband power amplifier in which a plurality of input signals in a plurality of bands are amplified by the amplifying transistor.

8. The power amplifier according to claim 1, wherein
the amplifying transistor, the bias circuit, and the impedance matching circuit are integrated on the semiconductor substrate, and
the power amplifier further comprises:
a circuit substrate on which the semiconductor substrate and the at least one of the chip inductor and the chip capacitor are mounted; and
a package resin disposed on the circuit substrate encapsulating the semiconductor substrate and the at least one of the chip inductor and the chip capacitor.

9. The power amplifier according to claim 6, wherein the power amplifier is a multiband power amplifier in which a plurality of input signals in a plurality of bands are amplified by the amplifying transistor.

10. The power amplifier according to claim 6, wherein
the amplifying transistor, the bias circuit, and the impedance matching circuit are integrated on the semiconductor substrate, and
the power amplifier further comprises:
a circuit substrate on which the semiconductor substrate and the chip capacitor are mounted; and
a package resin disposed on the circuit substrate and encapsulating the semiconductor substrate and the chip capacitor.

11. A power amplifier comprising:
a semiconductor substrate;
an input terminal;
an amplifying transistor located on the semiconductor substrate, amplifying a signal from the input terminal, and outputting an amplified signal to an output terminal;
a bias circuit supplying a bias to a signal input side of the amplifying transistor;
a filter circuit, including at least one of a chip inductor and a chip capacitor, removing noise at the signal input side of the amplifying transistor; and
an impedance matching circuit including a matching resistor, wherein the matching resistor is located on the semiconductor substrate, between the input terminal and the signal input side of the amplifying transistor, wherein
the filter circuit includes
a resistor located on the semiconductor substrate, wherein a first end of the resistor is connected to a connection point of the bias circuit and the signal input side of the amplifying transistor, and the chip capacitor, wherein a first end of the chip capacitor is connected to a second end of the resistor, and a second end of the chip capacitor is connected to ground.

* * * * *